United States Patent
Schmidt

(10) Patent No.: US 8,600,330 B2
(45) Date of Patent: Dec. 3, 2013

(54) FILTER ARRANGEMENT

(75) Inventor: Lothar Schmidt, Erbach (DE)

(73) Assignee: KATHREIN-Werke KG, Rosenheim (DE)

(*) Notice: Subject to any disclaimer, the term of this patent is extended or adjusted under 35 U.S.C. 154(b) by 0 days.

(21) Appl. No.: 13/253,256

(22) Filed: Oct. 5, 2011

(65) Prior Publication Data

US 2013/0090080 A1    Apr. 11, 2013

(51) Int. Cl.
    *H04B 1/10* (2006.01)

(52) U.S. Cl.
    USPC .......................... 455/306; 455/307

(58) Field of Classification Search
    USPC ................ 455/213, 306, 307, 338, 339
    See application file for complete search history.

(56) References Cited

U.S. PATENT DOCUMENTS

| | | | |
|---|---|---|---|
| 5,424,680 A * | 6/1995 | Nazarathy et al. | 330/149 |
| 7,230,996 B2 * | 6/2007 | Matsuura et al. | 375/296 |
| 7,324,793 B2 * | 1/2008 | Lee et al. | 455/130 |
| 2002/0009982 A1 | 1/2002 | Kim | |
| 2010/0007443 A1 | 1/2010 | Mohanty et al. | |

FOREIGN PATENT DOCUMENTS

| | | |
|---|---|---|
| CN | 102006029 | 4/2011 |
| KR | 1020090036327 | 4/2009 |
| WO | 95/28746 | 10/1995 |

OTHER PUBLICATIONS

Morgan, Theoretical & Experimental Study of a New Class of Reflectionless Filter, IEEE Transactions on Microwave Theory & Techniques, vol. 59, No. 5, May 2011, pp. 1214-1221.

* cited by examiner

*Primary Examiner* — Sonny Trinh
(74) *Attorney, Agent, or Firm* — Stephen H. Eland; Dann, Dorfman, Herrell & Skillman

(57) ABSTRACT

A filter arrangement for filtering a radio signal comprising at least a first filter stage is presented wherein the at least first filter stage comprises a divide stage for dividing a filter stage input signal into several signal portions. The signal portions are filtered in at least two parallel filter elements. A combine stage combines the separate filter output signals into a single filter stage output signal.

17 Claims, 7 Drawing Sheets

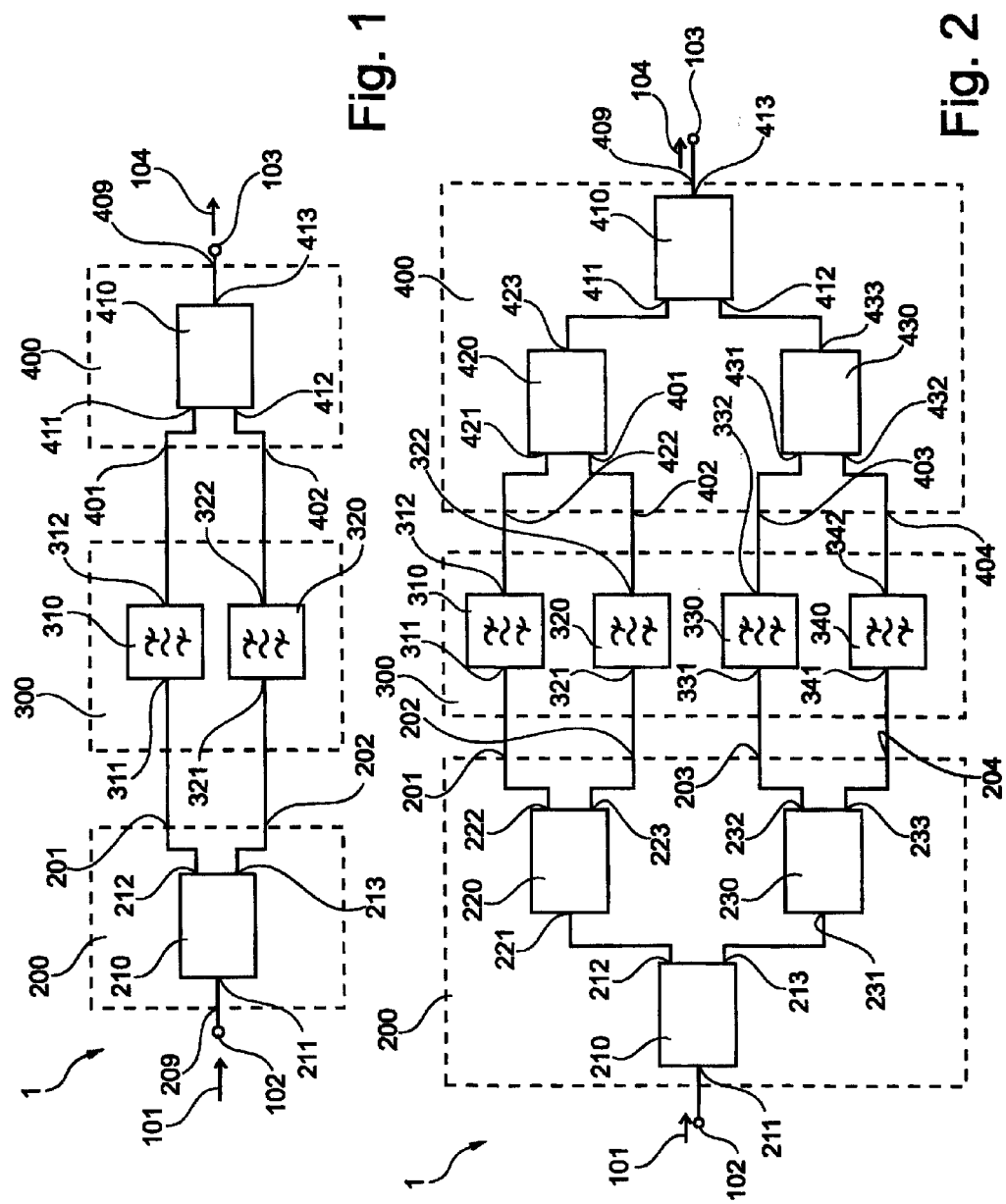

FILTER ARRANGEMENT

CROSS-REFERENCE TO RELATED APPLICATIONS

None

FIELD OF THE INVENTION

The field of the present application relates in general to a filter arrangement and in particular to a radio station with a filter arrangement. The field of the application also relates to a method of manufacturing a filter arrangement.

BACKGROUND OF THE INVENTION

Filters are designed, for example, for a specific frequency band. Signals within that specific frequency band will pass the filter from a first port to a second port whereas signals outside of the specific frequency band will be prevented from passing through the filter. The filters may be produced as a combination of resistors, inductors, and capacitors or as ceramic filters, such as but not limited to surface acoustic wave filters or film bulk acoustic resonators. Dependent on their technology each filter may be distinguishable from other filters by electrical characteristics such as insertion loss, out-band signal rejection, electric power durability, but also in size and price.

A special application of filters is a duplex filter for radio transceivers. A duplex filter enables a transmitter and a receiver to share a single antenna, by preventing a transmission signal from entering the receiver and, likewise, the received signal from entering the transmitter. The duplex filter usually comprises two separate band-pass filters, one of which is connected to the receiver section of the transceiver, and the other filter being connected to the transmitter section of the transceiver. Duplex filter designs are commercially available as off-the-shelf filters for a plurality of different circuit designs for the transceiver. However, the technical properties of these off-the-shelf filters may not always meet the design criteria a circuit designer has in mind when designing a radio station.

The use of mobile communications networks has increased over the last decade. Operators of the mobile communications networks have increased the number of base stations in order to meet an increased demand for service by users of the mobile communications networks. The operators of the mobile communications network wish to purchase components for the base stations at a lower price. As the size and price of radio stations goes down, there is a need to provide smaller and less expensive filters and duplex filters.

SUMMARY OF THE INVENTION

It is an aspect of the teachings of the present disclosure to provide a filter arrangement for filtering a radio signal comprising at least one filter stage. The at least one filter stage comprises a divide stage for dividing a filter stage input signal into at least a first signal portion, and at least a second signal portion, wherein the first signal portion is passed to at least a first divide stage output and the second signal portion is passed to at least a second divide stage output. The filter stage further comprises at least a first filter element comprising a first filter element input being connected to the first divide stage output and a first filter element output for providing at least a first filtered signal. The at least one filter stage further comprises at least a second filter element comprising a second filter element input being connected to the second divide stage output and a second filter element output for providing at least a second filtered signal. The first filter stage further comprises a combine stage for combining the first filtered signal, received at at least a first combine stage input and the second filtered signal, received at at least a second signal combiner input into a filter stage output signal.

Another aspect of the teachings of the present disclosure is a filter arrangement wherein the divide stage comprises at least a first signal divider and at least a second signal divider for dividing the filter arrangement input signal, wherein at least a first signal divider output of the first signal divider is connected to at least a first signal divider input of the second signal divider. A divide stage can thereby be formed by at least two concatenated signal dividers.

Another aspect of the filter arrangement is that the signal combining stage comprises at least a first signal combiner and a second signal combiner, wherein a first signal combiner output is connected to at least a second signal combiner input. A combiner stage can thereby be formed by at least two concatenated signal combiners.

Another aspect of the present disclosure is that at least one of the first filter element or the second filter element is a duplex filter with a first transmit port for passing a signal in a first frequency band to a first antenna port of the duplex filter and a first receive port for receiving a second signal in a second frequency band from the first antenna port. One of the first receive port of the duplex filter or the first transmit port of the duplex filter is connected via an impedance to a reference level. The filter property, for example, the suppression of signals in out-of band frequencies is thereby improved.

Another aspect of present disclosure is that at least one of the first filter element or the second filter element is a film bulk acoustic resonator filter (FBAR).

Another aspect of the present disclosure is that the film bulk acoustic resonator filter (FBAR) is a duplex filter with a first port for passing a signal in a first frequency band to an antenna port of the FBAR filter and a second port for receiving a second signal in a second frequency band from the antenna port. One of the first port of the FBAR duplexer or the second port of the duplex FBAR filter is connected via an impedance to a reference level.

Another aspect of the present disclosure is that the signal divider and the signal combiner are bidirectional couplers. The bidirectional couplers may be so-called Wilkinson combiner or so-called quadrature hybrids.

Another aspect of the teaching of this application is to provide a chipset comprising a filter arrangement for filtering a radio signal comprising a filter stage. The filter stage comprises a first signal divider for distributing at least a first portion and at least a second portion of a first signal divider input signal received at a first signal divider input to an at least first signal divider output and an at least second signal divider output. The filter stage further comprises a first signal combiner for combining an at least first signal received at an at least first signal combiner input and an at least second signal received at a at least second signal combiner input into a first combined output signal. The filter stage further comprises an at least first filter element with a first filter element input being connected to the at least first output of the first signal divider and a first filter element output being connected to the at least first signal combiner input of the signal combiner, and an at least a second filter element with a second filter element input being connected to the at least a second output of the signal divider and a second filter element output being connected to the at least a second combiner input of the first signal combiner.

Another aspect of the teaching of this application is a radio station comprising a filter arrangement for filtering a radio signal comprising a filter stage. The filter stage comprises a first signal divider for distributing at least a first portion and at least a second portion of a first signal divider input signal received at a first signal divider input to at least a first signal divider output and at least a second signal divider output. The filter stage further comprises a first signal combiner for combining at least a first signal received at at least a first signal combiner input and at least a second signal received at at least a second signal combiner input into a first combined output signal. The filter stage further comprises at least a first filter element with a first filter element input being connected to the first output of the first signal divider and a first filter element output being connected to the first signal combiner input of the signal combiner, and at least a second filter element with a second filter element input being connected to the second output of the signal divider and a second filter element output being connected to the at least second combiner input of the first signal combiner.

Another aspect of the teaching of this disclosure is a computer program product comprising a non-transitory computer-usable medium having control logic stored therein for causing a computer to manufacture a filter arrangement for filtering a radio signal comprising a filter stage. The filter stage comprises a first signal divider for distributing an at least a first portion and at least a second portion of a first signal divider input signal received at a first signal divider input to an at least first signal divider output and an at least second signal divider output. The filter stage further comprises a first signal combiner for combining at least a first signal received an at least a first signal combiner input and at least a second signal received at at least a second signal combiner input into a first combined output signal. The filter stage further comprises at least a first filter element with a first filter element input being connected to the first output of the first signal divider and a first filter element output being connected to the first signal combiner input of the signal combiner, and a second filter element with a second filter element input being connected to the second output of the signal divider and a second filter element output being connected to the at least second combiner input of the first signal combiner.

DESCRIPTION OF THE FIGURES

FIG. 1 shows a first aspect of the filter arrangement according to the present disclosure FIG. 2 shows a further aspect of the filter arrangement according to the present disclosure

DETAILED DESCRIPTION OF THE INVENTION

Figure 3:
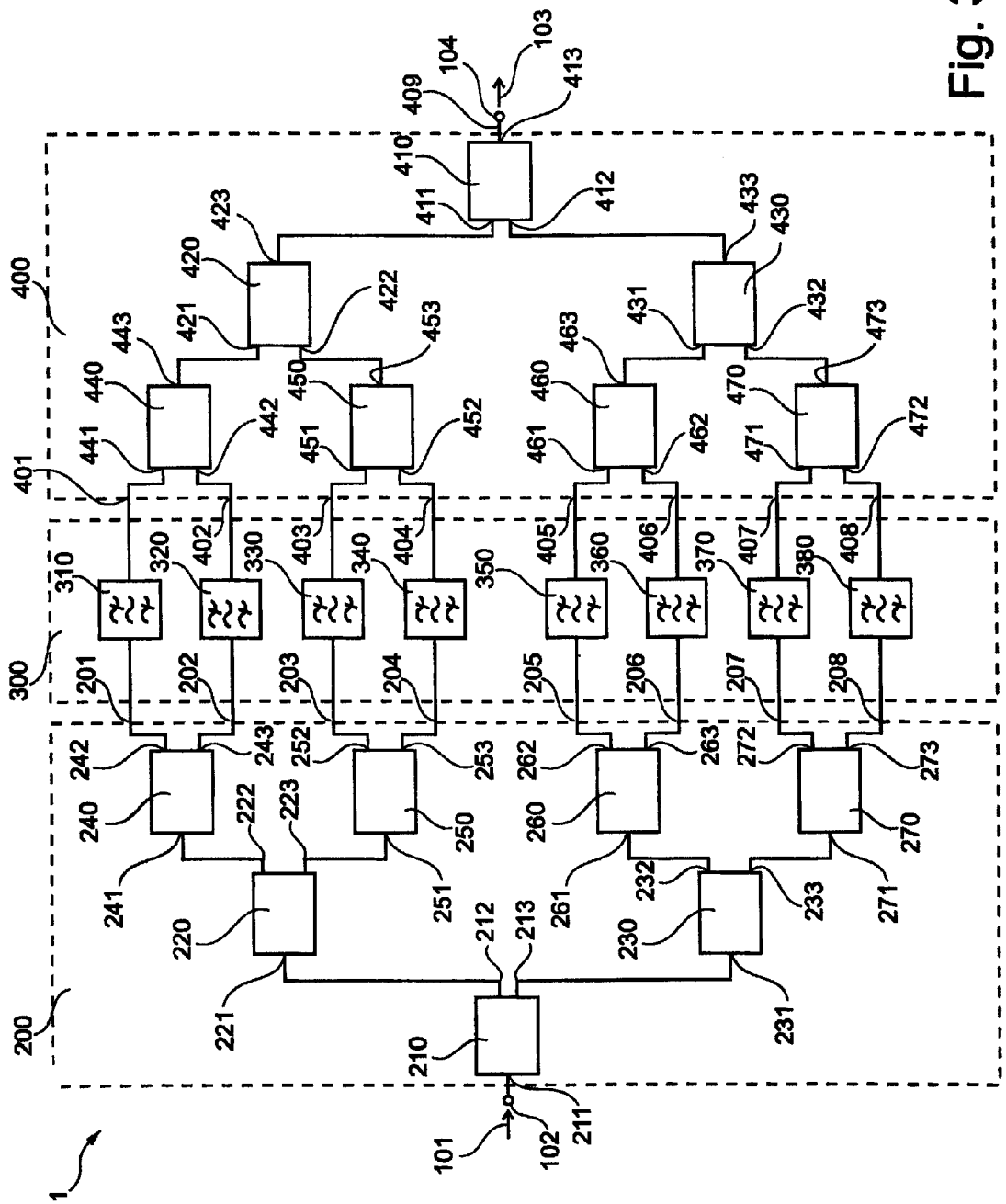
FIG. 3 shows yet another aspect of the filter arrangement according to the present disclosure

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

FIG. 1 shows a first aspect of a filter arrangement 1 according to the present disclosure for filtering a filter arrangement input signal 101 received at a filter arrangement input 102 and providing a filter arrangement output signal 104 at a filter arrangement output 103. The filter arrangement input signal may be but is not limited to a transmit signal or a receive signal. In this aspect of the present disclosure a plurality of transmit signals use adjacent frequencies and form a transmit band. A plurality of receive signals use adjacent frequencies and form a receive band. The transmit band and the receive band are distinct to each other.

From the filter arrangement input 102 the filter arrangement input signal 101 is first passed through a divide stage 200 wherein the filter arrangement input signal 101 is split up into a first and a second divide stage output signal which are provided at a first signal divide stage output 201 and a second divide stage output 202. The first filter stage output signal and the second filter stage output signals pass each through a first filter element 310 and a second filter element 320 which constitute a first filter element stage 300, producing a first filter stage output signal and a second filter stage output signal. In a combine stage 400 the first filter element stage output signal and the second filter element stage output signal, received respectively at a first filter combine stage input 401 and a second filter combine stage input 402 are combined into a first combine stage signal, which is provided at a first combine stage output 409. In this aspect of the disclosure the first combine stage output coincides with the first filter arrangement output 103. The filter elements may be, but are not limited to band pass filters for a transmitting band or band pass filter for a receiving band.

In the first aspect of the present disclosure the divide stage 200 is formed by a first signal divider 210. The first signal divider 210 is connected to the first divide stage input 102. The first signal divider 210 splits a first signal divider input signal received at the first signal divider input 211 into a first portion and a second portion of the signal divider input signal. The first portion of the signal divider input signal is provided at a first signal divider output 212, which forms the first divide stage output 201. The second portion of the signal divider input signal is provided at a second signal divider output 213, which forms the second divide stage output 202.

The first divide stage output 201 is connected to a first filter element input 311 of the first filter element 310, whereas the second divide stage output 202 is connected to a second filter element input 321 of the second filter element 320.

In the first aspect of the present disclosure the combine stage 400 is formed by a first signal combiner 410 comprising a first signal combiner input 411 and a second signal combiner input 412. In the first aspect of the present disclosure the first signal combiner input 411 coincides with the first combine stage input 401 and the second signal combiner input 412 coincides with the second combine stage input 402. By means of this arrangement depicted in FIG. 1, the first filter element output 312 of the first filter element 310 is connected to the first signal combiner input 411 of the first signal combiner 410 and the second filter element output 322 of the second filter element 320 is connected to the second signal combiner input 412 of the first signal combiner 410. The first signal combiner 410 combines the input signals at the first signal combiner input 411 and the second combiner input 412 into a first signal combiner output signal, which is provided at a signal combiner output 413. As the signal combiner output 413 coincides in this aspect of the disclosure with the filter stage output 103, the signal combiner output signal constitutes in this aspect of the present disclosure a filter stage output signal of the filter stage 1 as well as the filter arrangement output signal 104.

In the case that the first divide stage 200 is chosen to equally split the power of the first filter arrangement input signal, each one of the first filter element 310 and the second filter element 320 have to carry only half of the power of the filter arrangement input signal 101. By this division of the power of the filter arrangement signal 101, the filter stage 300 can be designed for a twice as high power durability than each of the separate first filter element 310 and the second filter elements 320 is specified for.

Some filter characteristics of the filter stage 300 are not affected by the parallel arranged first filter element 310 and second filter element 320, if losses in the first signal divider 210 and in the first signal combiner 410 are neglected. For example the insertion loss, e.g. the attenuation of a signal that passes the filter stage 300 is independent of the number of parallel-arranged filter elements 310, 320. It will be appreciated that the signal delay through the first filter element 310 and the second filter element 320 should be within a certain tolerance limit in order to ensure that the output power at the first filter arrangement output 103 is not significantly degraded.

The person skilled in the art will appreciate that a filter stage 300 may also comprise more than two parallel filter elements 310, 320. Signal divider with multiple output signals and signal combiner with multiple inputs are part of the state of the art and may be chosen accordingly to use a plurality of parallel filter elements in one filter stage. The power of the filter arrangement signal can be distributed accordingly.

FIG. 2 shows a second aspect of a filter arrangement 1 according to the present disclosure, wherein the filter arrangement 1 again comprises a divide stage 200, a filter stage 300 and a combine stage 400. In this aspect of the present disclosure the divide stage 200 splits the first filter arrangement input signal 101 into a first filter stage output signal, a second filter stage output signal, a third filter stage output signal and a fourth filter stage output signal which are provided at a first divide stage output 201, a second divide stage output 202, a third divide stage output 203 and a fourth divide stage output 204. The filter stage 300 comprises consequently four separate filter elements, a first filter element 310, a second filter element 320, a third filter element 330 and a fourth filter element 340. A first filter element output signal from the first filter element 310 is passed to a first combine stage input 401. A second filter element output signal from the second filter element 320 is passed to a second combine stage input 402. A third filter element output signal from the third filter element 330 is passed to a third combine stage input 403 and a fourth filter element output signal from the fourth filter element 340 is passed to a fourth combine stage input 404. The combine stage 400 combines a first combine stage input signal received at the first combine stage input 401, a second combine stage input signal received at the second combine signal stage input 402, a third combine stage input signal received at the third combine stage input 403 and a fourth combine stage input signal received at the he fourth combine stage input 404 into a combine stage output signal which is passed to a combine stage output 409 which coincides in this aspect of the present disclosure with the filter arrangement output 103.

In this aspect of the present disclosure the divide stage 200 is formed by a first signal divider 210, a second signal divider 220 and a third signal divider 230. A first signal divider input 211 is identical to the first combine stage input 102. The first signal divider 210 splits a first signal divider input signal, received at the first signal divider input 211 into a first portion and a second portion of the first signal divider input signal. The first portion of the first signal divider input signal is provided at a first signal divider output 212 and the second portion of the first signal divider input signal is provided at a second signal divider output 213. The first signal divider output 212 is connected to a second signal divider input 221 of the second signal divider 220 and the second signal divider output 213 is connected to a third signal divider input 231 of the third signal divider 230. The second signal divider 220 splits a second signal divider input signal, received at the second signal divider input 221 into a third portion and a fourth portion of the second signal divider input signal. The third portion of the second signal divider input signal is provided at a third signal divider output 222, which is in this aspect of the present disclosure identical to the divide stage output 201. The fourth portion of the second signal divider input signal is provided at a fourth signal divider output 223, which is in this aspect of the present disclosure identical to the second divide stage output 202. The third signal divider 230 splits a third signal divider input signal, received at the third signal divider input 231 into a fifth portion and a sixth portion of the third signal divider input signal. The fifth portion of the third signal divider input signal is provided at a fifth signal divider output 232, which is in this aspect of the present disclosure identical to the third divide stage output 203. The sixth portion of the third signal divider input signal is provided at a sixth signal divider output 233, which is in this aspect of the present disclosure identical to the fourth divide stage output 204.

The combine stage 400 comprises a first signal combiner 410, a second signal combiner 420 and a third signal combiner 430. The first combine stage input 401 is connected to a third signal combiner input 421 of the second signal combiner 420, and the second combine stage input 402 is connected to a fourth signal combiner input 422 of the second signal combiner 420. The second signal combiner 420 combines the third input signal and the fourth input signal received at the third signal combiner input 421 and the fourth signal combiner input 422 into a second signal combiner output signal, which is provided at a second signal combiner output 423. The third combine stage input 403 is connected to a fifth signal combiner input 431 of the third signal combiner 430, and the fourth combine stage input 404 is connected to a sixth signal combiner input 432 of the third signal combiner 430. The third signal combiner 430 combines the fifth input signal and the sixth input signal received at the fifth signal combiner input 431 and the sixth signal combiner input 432 into a third single signal combiner output signal which is provided at a third signal combiner output 433. Finally the second signal combiner output 423 is connected to a first signal combiner input 411 of the first signal combiner 410, and the third signal combiner output 433 is connected to a second signal combiner input 412 of the first signal combiner 410. The first signal combiner 410 combines the first input signal and the second input signal received at the first signal combiner input 411 and the second signal combiner input 412 into a first single signal combiner output signal which is provided at a first signal combiner output 413. The first single signal combiner output signal forms in this aspect of the present disclosure the output signal of the combine stage 400 and thereby also forms the filter arrangement output signal 104.

By the circuit arrangement of this aspect of the present disclosure the four filter elements (the first filter element 310, the second filter element 320, the third filter element 330 and the fourth filter element 340) are used in parallel. If each of the first signal divider 210, the second signal divider 220 and third signal divider 230 splits the power of each of the first signal divider input signal, the second signal divider input signal and the third signal divider input signal in two equal power portions, each one of the filter elements is charged only with a fourth of the power of the filter arrangement input signal 101. After the recombination of the first filter output signal, the second filter output signal, the third filter output signal and the fourth filter output signal in the combine stage 400, apart from the insertion losses, the filter arrangement output signal 104 is again at the power level of the filter arrangement input signal 101.

The person skilled in the art will readily appreciate that by adding additional signal dividers and cascading them in the same manner as in the second aspect of this disclosure described, the number of outputs of the divide stage can be extended in a fan-out like form to any required number of parallel output signals. This is also applicable to the combine stage 400, wherein any required number of input signals can be combined by adding an appropriate number of additional signal combiners and connecting them in a fan-in like form. In this aspect of the present disclosure, where each signal divider splits an input signal into two signal portions, each signal divider may be chosen to split a signal divider input signal into a number of signal portions greater than two. By combining different ones of signal dividers with different number of divided output signals any arbitrary required number of divide stage output signals can be generated.

FIG. 3 shows a third aspect of the filter arrangement 1 according to the present disclosure, wherein a divide stage 200 is formed by a first signal divider 210, a second signal divider 220, a third signal divider 230, a fourth signal divider 240, a fifth signal divider 250, a sixth signal divider 260 and a seventh signal divider 270. The arrangement of the first signal divider 210, the second signal divider 220 and the third signal divider 230 is identical to the arrangement of the first signal divider 210, the second signal divider 220 and the third signal divider 230 described in the second aspect of the present disclosure, to which is made reference here. Instead of forming the first divide stage output, the third signal divider output 222 in the third aspect of the present disclosure is connected to a fourth signal divider input 241 of the fourth signal combiner 240. In the same manner the fourth signal divider output 223 is connected to a fifth signal divider input 251 of the fifth signal combiner 250, the fifth signal combiner output 232 is connected to a sixth signal combiner input 261 of the sixth signal combiner 260, and the sixth signal divider output 233 is connected to a seventh signal combiner input 271 of the seventh signal divider 270. A seventh signal divider output 242 of the fourth signal divider 240 forms the first divide stage output 201 of the divide stage 200; a eighth signal divider output 243 of the fourth signal divider 240 forms the second divide stage output 202 of the divide stage 200; a ninth signal divider output 252 of the fifth signal divider 250 forms the third divide stage output 203 of the divide stage 200; a tenth signal divider output 253 of the fifth signal divider 250 forms the fourth divide stage output 204 of the divide stage 200; a eleventh signal divider output 262 of the sixth signal divider 260 forms the fifth divide stage output 205 of the divide stage 200; a twelfth signal divider output 263 of the sixth signal divider 260 forms the sixth divide stage output 206 of the divide stage 200; a thirteenth signal divider output 272 of the seventh signal divider 270 forms the seventh divide stage output 207 of the divide stage 200; and a fourteenth signal divider output 273 of the seventh signal divider 270 forms the eighth divide stage output 208 of the divide stage 200.

In an inverse manner to the signal divider stage 200 the combine stage 400 in this aspect of the present disclosure is extended to eight signal combiner input signals. A first combine stage input 401 is connected to a seventh signal combiner input 441 of a fourth signal combiner 440; a second combine stage input 402 is connected to an eighth signal combiner input 442 of the fourth signal combiner 440; a third combine stage input 403 is connected to a ninth signal combiner input 451 of a fifth signal combiner 450; a fourth combine stage input 404 is connected to a tenth signal combiner input 452 of the fifth signal combiner 450; a fifth combine stage input 405 is connected to an eleventh signal combiner input 461 of a sixth signal combiner 460; a sixth combine stage input 406 is connected to a twelfth signal combiner input 462 of the sixth signal combiner 460; a seventh combine stage input 407 is connected to a thirteenth signal combiner input 471 of a seventh signal combiner 470; a eighth combine stage input 408 is connected to a fourteenth signal combiner input 472 of the seventh signal combiner 470. A fourth signal combiner output 443 of the fourth signal combiner 440 is connected to a third signal combiner input 421 of the second signal combiner 420 and a fifth signal combiner output 453 of the fifth signal combiner 450 is connected to a fourth signal combiner input 422 of the second signal combiner 420. A sixth signal combiner output 463 of the sixth signal combiner 460 is connected to a fifth signal combiner input 431 of the third signal combiner 430; and a seventh signal combiner output 473 of the seventh signal combiner 470 is connected to a sixth signal combiner input 432 of the third signal combiner 430. Finally a second signal combiner output 423 of the second signal combiner 420 is connected to a first signal combiner input 411 of the first signal combiner 410 and a third signal combiner output 433 of the third signal combiner 430 is connected to a second signal combiner input 412 of the first signal combiner 410. In this aspect of the present disclosure the first signal combiner output 413 of the first signal combiner 410 forms the output 103 of the filter arrangement 1.

In this aspect of the present disclosure the power of the filter arrangement input signal 101 is equally split into eight separate portion signals which are passed through a first filter element 310, a second filter element 320, a third filter element 330, a fourth filter element 340, a fifth filter element 350, a sixth filter element 360, a seventh filter element 370, and an eighth filter element 380 of the filter stage 300. By splitting up the input signal into eight equal power portions an eight times higher power can be passed through the filter stage 300 in comparison to the power durability of each of the first filter element 310, the second filter element 320, the third filter element 330, the fourth filter element 340, the fifth filter element 350, the sixth filter element 360, the seventh filter element 370, and the eight filter element 380.

Another aspect of the present disclosure is that this kind of filter arrangement enables the use of film bulk acoustic resonator filter (FBAR). Bulk acoustic resonator filters are piezoelectric filters, which are far smaller than other types of filters, like ceramic filters or surface acoustic resonators (SAW). However, due to their relatively small power durability at the time of the present disclosure their use in transceivers has been limited to transceivers with a maximum output power of +30 dBm. For example a typical miniature PCS/UMTS Band pass filter is available at the time of the present disclosure from AVAGO technologies under the product name ACMD-7005. The data sheet of this band pass filter shows a high power rating of +30 dBm. By using a filter arrangement as disclosed in this aspect of the present disclosure this filter arrangement can be used in transceivers with an output power of +39 dBm, as each doubling of the number of parallel arranged filter elements adds an additional power durability of +3 dbm (e.g. distributing the power on two filter elements increases the maximum output power by +3 dB, distributing the power on four filter elements increases the maximum output power by +6 dB, distributing the power on eight filter elements increases the maximum output power by +9 dB compared to a single filter element). Although to achieve this effect seven signal dividers and seven signal combiners have to be provided, the overall space requirement and the overall costs are similar to a conventional transceiver design with only a single common ceramic filter provided for comparable power durability, but volume and weight are significantly lower.

Figure 4:
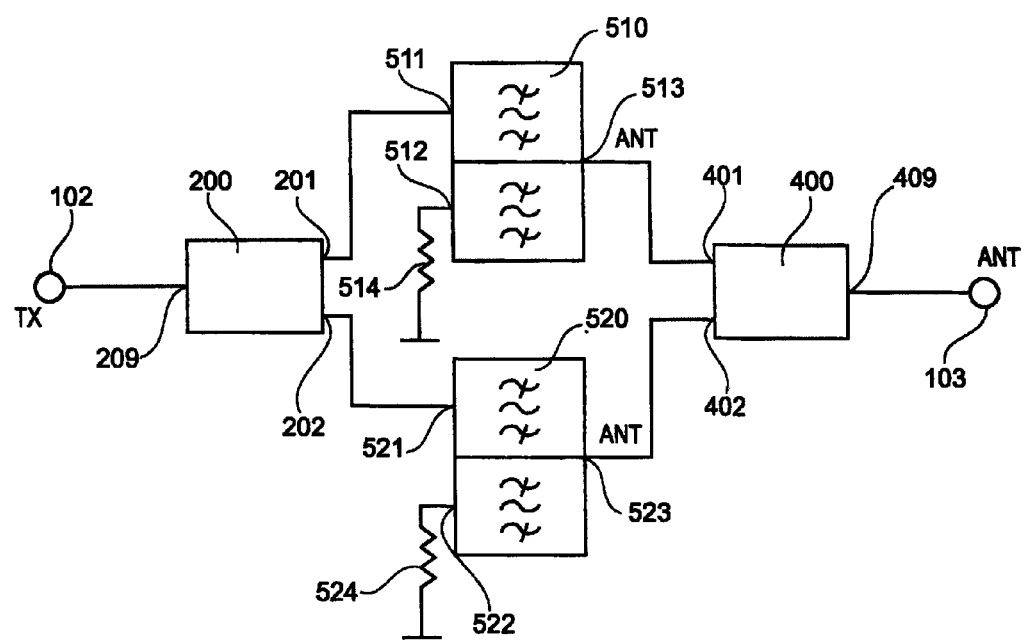
FIG. 4 shows yet another aspect of the filter arrangement according to the present disclosure

Another aspect of the present disclosure is to use a duplex filter for a filter element instead of a band pass filter. In this aspect of the present disclosure a filter output of this duplex filter is not used, but terminated with a load impedance. FIG. 4 shows a filter arrangement with a divide stage 200, a first duplex filter 510 and a second duplex filter 520 and a combine stage 400. Apart from the first duplex filter 510 and the second duplex filter 520 this filter arrangement is identical to the filter arrangement described in FIG. 1 of the present disclosure. The first divide stage output 201 of the divide stage 200 is connected to a first transmit port 511 of the first duplex filter 510. A first antenna port 513 of the first duplex filter 510 is connected to a first combine stage input 401 of the combine stage 400. A first receive port 512 of the duplex filter 510 is connected via a load impedance 514 to a reference level. The second divide stage output 202 of the divide stage 200 is connected to the second transmit port 521 of the second duplex-filter 520. The second antenna port 523 of the second duplex-filter 520 is connected to the second combine stage input 402 of the second signal combiner 400. A second receive port 522 of the second duplex filter 520 is connected via a second load impedance 524 to reference level.

Figure 5:
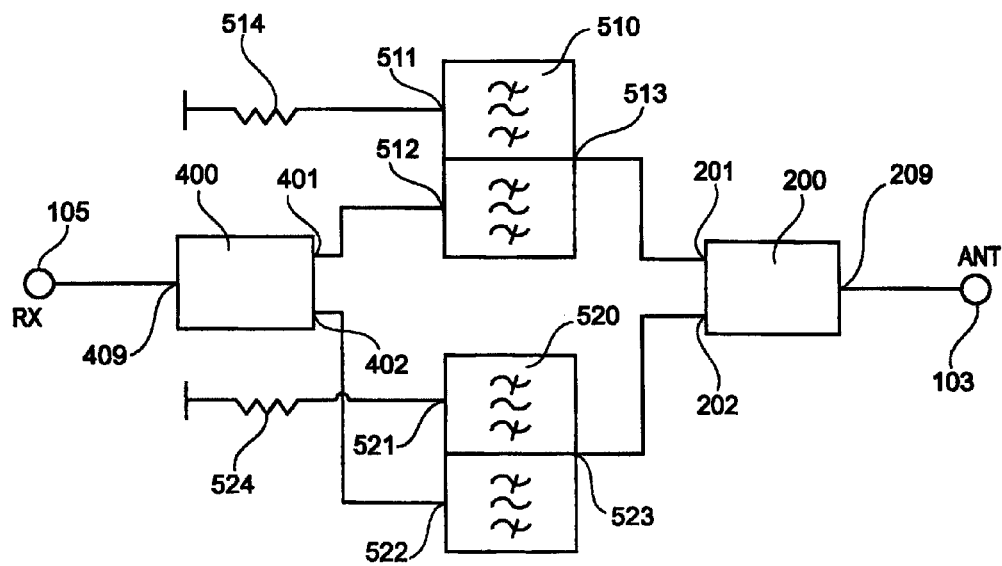
FIG. 5 shows yet another aspect of the filter arrangement according to the present disclosure

FIG. 5 shows another aspect of the present disclosure that is similar to the aspect shown in FIG. 4. In this FIG. 5 aspect a first duplex filter 510 and a second duplex filter 520 are used for filtering a receive signal. A receive signal at an antenna terminal 103 is passed to a signal stage input 209 of a divide stage 200. The divide stage 200 divides the receive signal in a first signal portion provided at a first divide stage output 201 and a second signal portion provided at a divide stage output 202. The first divide stage output 201 is connected to an antenna port 513 of the first duplex filter 510 and the second divide stage output 202 is connected to the second antenna port 523 of the second duplex filter 520. A first receive port 512 of the first duplex filter 510 is connected to a first signal combiner stage input 401 of a first signal combiner stage 400. A second receive port 522 of the second duplex filter 520 is connected to a second combine stage input 402. A first transmit port 511 of the first duplex filter 510 is connected via a first load impedance 514 with a reference level and a second transmit port 521 of the second duplex filter 520 is connected with a second load impedance 524 with a reference level. The combiner 400 combines the first signal portion filtered through the first duplex filter 510 and received at the first combine stage input 401 with the second signal portion filtered through the second duplex filter 520 and received at the second combine stage input 402 to produce a combined signal at the combine stage output 409 which is passed to a receive signal terminal 105. In this aspect of the present disclosure the suppression of noise/interference from transmit signals in the receive signal RX is improved.

Figure 6:
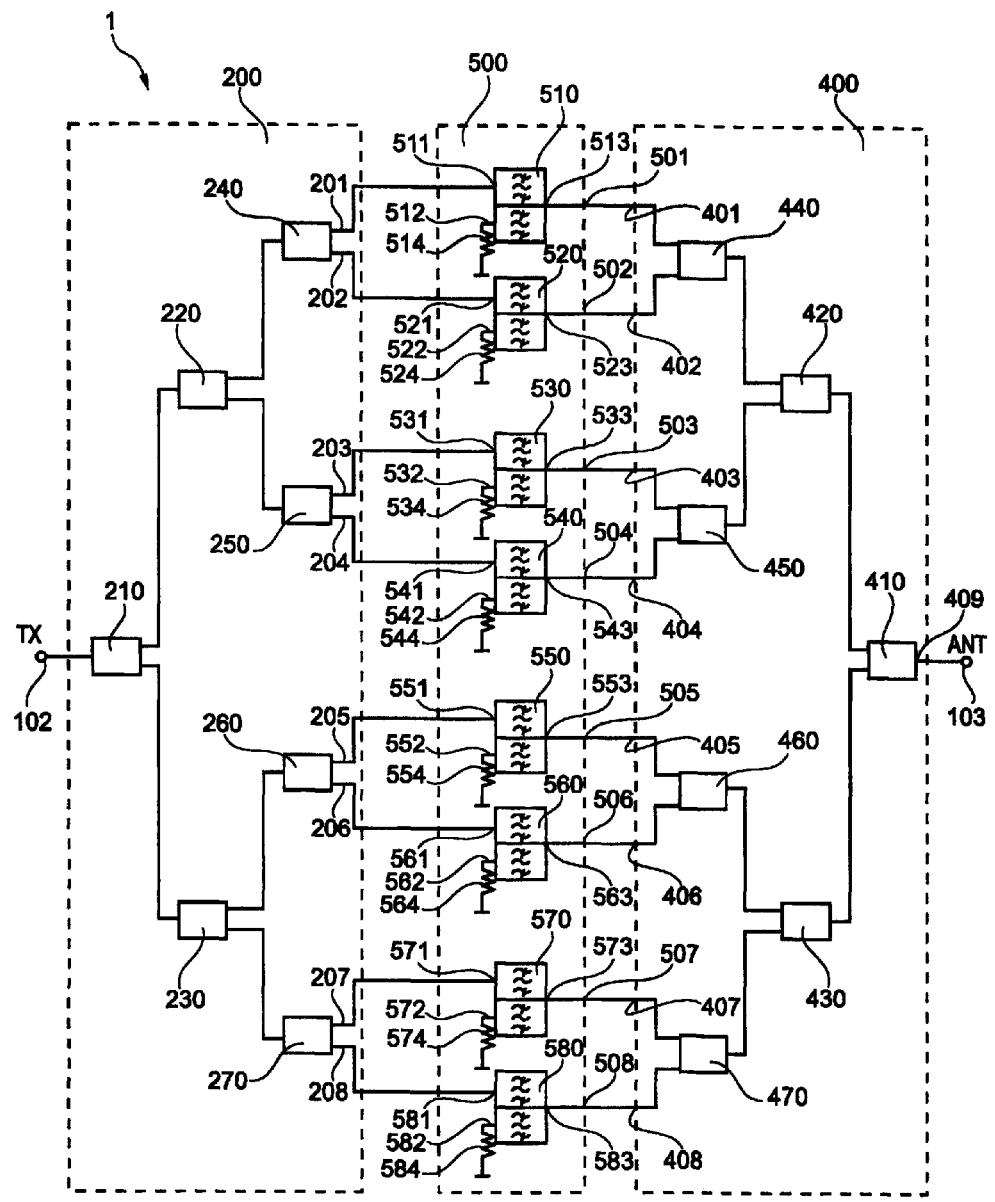
FIG. 6 shows yet another aspect of the filter arrangement according to the present disclosure

FIG. 6 shows a filter arrangement 1 for filtering a transmit signal received at a filter arrangement input 102 and providing a filtered transmit signal at a filter arrangement output 103. The filter arrangement of FIG. 6 is similar to the filter arrangement 1 described in FIG. 3 and comprises also a divide stage 200 and a combine stage 400. The divide stage 200 and the combine stage 400 are identical to the divide stage 200 and the combine stage 400 shown in FIG. 3. In contrast to the aspect of the present disclosure described in FIG. 3 this aspect of the present disclosure uses as filter elements a first duplex filter 510, a second duplex filter 520, a third duplex filter 530, a fourth duplex filter 540, a fifth duplex filter 550, a sixth duplex filter 560, a seventh duplex filter 570, and an eighth duplex filter 580. A first divider stage output 201 of the divider stage 200 is connected to a first duplex filter transmit port 511 of the first duplex-filter 510; a second divider stage output 202 of the divider stage 200 is connected to a second duplex filter transmit port 521, a third divider stage output 203 of the divider stage 200 is connected to a third duplex filter transmit port 531, a fourth divider stage output 204 of the divider stage 200 is connected to a fourth duplex filter transmit port 541, a fifth divider stage output 205 of the divider stage 200 is connected to a fifth duplex filter transmit port 551, a sixth divider stage output 206 of the divider stage 200 is connected to a sixth duplex filter transmit port 561, a seventh divider stage output 207 of the divider stage 200 is connected to a seventh duplex filter transmit port 571, and an eighth divider stage output 208 of the divider stage 200 is connected to a eighth duplex filter transmit port 581. A first duplex filter antenna port 513 is connected to a first combine stage input 401 of the combine stage 400; a second duplex filter antenna port 523 is connected to a second combine stage input 402 of the combine stage 400; a third duplex filter antenna port 533 is connected to a third combine stage input 403 of the combine stage 400; a fourth duplex filter antenna port 543 is connected to a fourth combine stage input 404 of the combine stage 400; a fifth duplex filter antenna port 553 is connected to a fifth combine stage input 405 of the combine stage 400; a sixth duplex filter antenna port 563 is connected to a sixth combine stage input 406 of the combine stage 400; a seventh duplex filter antenna port 573 is connected to a seventh combine stage input 407 of the combine stage 400; and a eighth duplex filter antenna port 583 is connected to a eighth combine stage input 408 of the combine stage 400. A first duplex filter receive port 512 is loaded with a first load impedance 514; a second duplex filter receive port 522 is loaded with a second load impedance 524; a third duplex filter receive port 532 is loaded with a third load impedance 534; a fourth duplex filter receive port 542 is loaded with a fourth load impedance 544, a fifth duplex filter receive port 552 is loaded with a fifth load impedance 554, a sixth duplex filter receive port 562 is loaded with a sixth load impedance 564; a seventh duplex filter receive port 572 is loaded with a seventh load impedance 574; and an eighth duplex filter receive port 582 is loaded with an eighth load impedance 584. The combine stage combines the eight filtered transmit signal portions into a single signal, which is provided at the combine stage output 409 of the combine stage 400. Due to the eight parallel duplex filter, the power durability of the filter arrangement can be increased to the eight times of the power durability of a single duplex filter.

Figure 7:
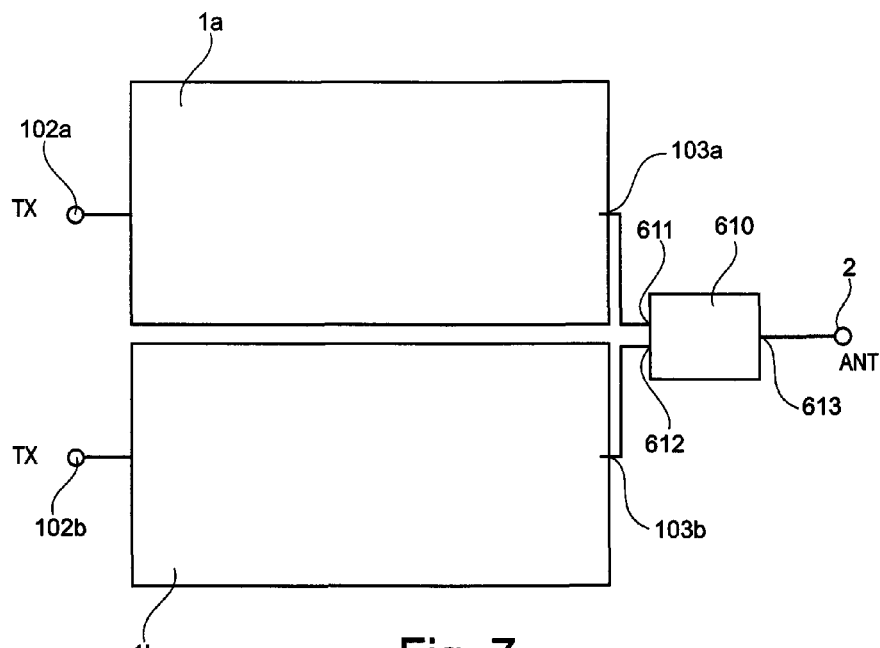
FIG. 7 shows yet another aspect of the filter arrangement according to the present disclosure

The person skilled in the art will readily appreciate that more than one filter arrangement can be used, either in a transmitter, a receiver or a transceiver. In another aspect of the present disclosure depicted in FIG. 7 a first filter arrangement 1a and a second filter arrangement 1b may be used in a multi-band transmitter for transmitting signals in two different frequency bands but profiting from the two different frequency bands sharing the same antenna. In this arrangement a first filter arrangement output 103a of the first filter arrangement 1a is connected to a first antenna coupler port 611 of an antenna coupler 610 and a second filter arrangement output 103b of the second filter arrangement 1b is connected to a second antenna coupler port 612 of the antenna coupler 610. A third antenna coupler port 613 provides the combined output signal of a first transmit signal TX. The antenna coupler 610 is a bidirectional coupler and should be a duplexer to avoid losses in the signals.

Figure 8:
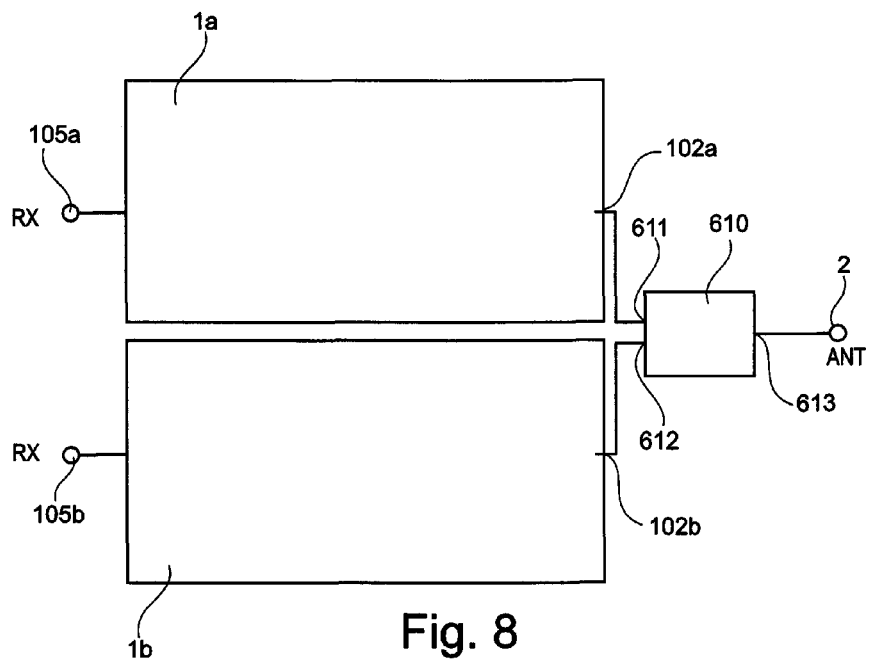
FIG. 8 shows yet another aspect of the filter arrangement according to the present disclosure.

In a similar arrangement depicted in FIG. 8 a first filter arrangement input 102a is connected to a first antenna coupler port 611 and a second filter arrangement input 102b is connected to a second antenna coupler port 612. The antenna coupler 610 distributes a receive signal RX to the first antenna coupler port 611 and the second antenna coupler port 612. The filter elements in the first filter arrangement 1a are adapted for filtering signal in a first receive frequency band and the filter elements in the second filter arrangement 1b are adapted to filter signals in a second receive frequency band. As the first receive frequency band and the second receive frequency band are distinct from each other an input signal either passes the one or the other of the first filter arrangement 1a or the filter arrangement 1b. A signal outside of the first receive frequency band and outside of the second frequency band will be blocked from the first filter arrangement 1a as well as from the second filter arrangement 1b. In this manner the first filter arrangement 1a and the second filter arrangement 1b may be used in a multi-band receiver to receive signals in two different receive frequency bands and process them separately.

Figure 9:
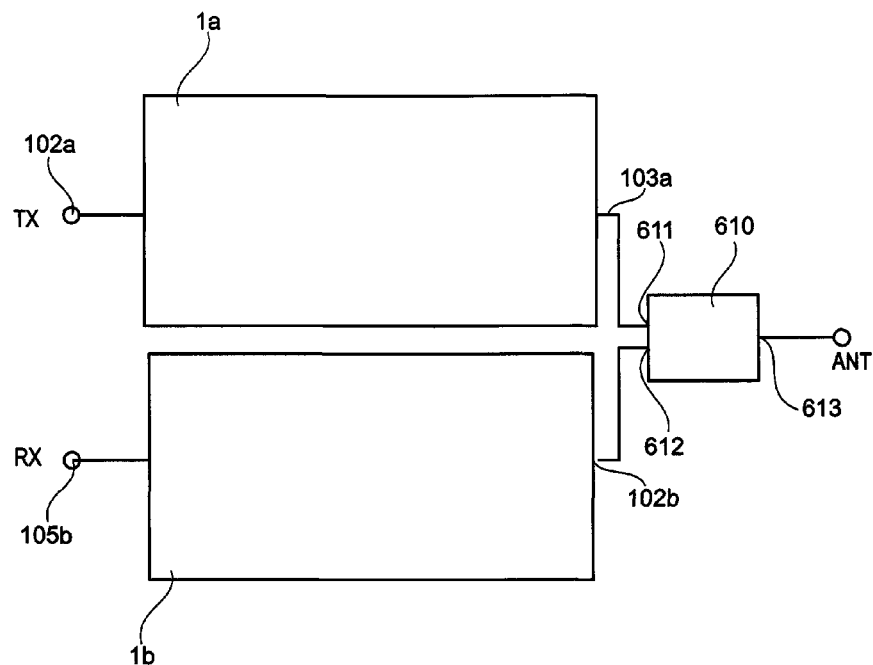
FIG. 9 shows yet another aspect of the filter arrangement according to the present disclosure.

FIG. 9 shows another aspect of the present disclosure with a first filter arrangement 1a that is used in the transmitter of a transceiver and a second filter arrangement 1b that is used in the receiver of a transceiver. A first filter arrangement output 103a of the first filter arrangement 1a is connected to a first antenna coupler port 611 of the antenna coupler 610. A second filter arrangement input 102b is connected to a second antenna coupler port 612 of the antenna coupler 610. A third antenna coupler port 613 is connected to an antenna terminal as mentioned in connection with FIG. 7, the coupler 610 should preferably be a duplexer to substantially avoid signal losses.

The antenna coupler 610 is formed by a bidirectional antenna coupler which passes the filtered transmit signal from the first antenna coupler port 611 to the third antenna coupler port 613 and a receive signal, received a the third antenna port 613, to the second antenna coupler port 612. The antenna duplex filter 610 substantially passes a receive signal RX from the antenna terminal to the second filter arrangement 1b and substantially passes a transmit signal from a first filter arrangement input 102a and the antenna duplex filter 610 to the antenna terminal.

The first filter arrangement 1a and the second filter arrangement 1b can be any of the described first filter arrangements in FIG. 1, FIG. 2, FIG. 3, FIG. 4, FIG. 5, or FIG. 6 but are not limited to the described filter arrangements in the present disclosure. In case the first filter arrangement 1a and the second filter arrangement 1b have an identical structure, but not necessarily adapted to the same frequencies, such a filter arrangement may be called symmetrical. According to the chosen design in the aspects of the present disclosure shown in FIG. 7, FIG. 8 and FIG. 9 the first filter arrangement 1a may differ from the second filter arrangement 1b in the number of signal dividers, filter elements and signal combiners. In the following aspects of the present disclosure some of the various combinations of such an asymmetrical filter design are described and discussed.

Figure 10:
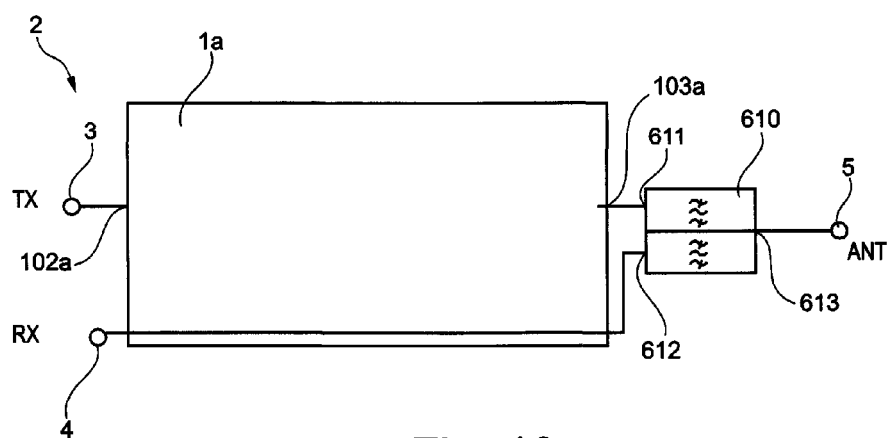
FIG. 10 shows yet another aspect of the filter arrangement according to the present disclosure.

FIG. 10 shows another aspect of the present disclosure with a transmit filter arrangement 1a that is connected to a first antenna duplex filter transmit port 611 of a first antenna duplex filter 610 thus providing a duplex filter arrangement 2. In contrast to the aforementioned duplex filters 510 . . . 580 that have been used with a load impedance at the receive port to improve the filter characteristics, the first antenna duplex filter 610 is used in this aspect of the present disclosure to separate transmit signals TX provided at a duplex filter arrangement antenna port 613 and receive signals RX received at the duplex filter arrangement antenna port 613. At a duplex filter arrangement input 3 the transmit signal TX is passed to the first filter arrangement input 102a of the first transmit filter arrangement 1a. The first filter arrangement 1a can be any of the described first filter arrangements in FIG. 1, FIG. 2, FIG. 3, FIG. 4, FIG. 5, or FIG. 6 but is not limited to the described filter arrangements in the present disclosure. The first filter arrangement output 103a of the first filter arrangement 1a is connected to the first antenna duplex filter transmit port 611 of the first antenna duplex filter 610. A first antenna duplex filter antenna port 613 of the first antenna duplex filter 610 forms an antenna terminal 5 for providing an antenna signal ANT. A first antenna duplex filter receive port 612 of the first antenna duplex filter 610 passes signals received at the antenna port 5, which are in the receive band, to a duplex filter arrangement receiver terminal 4.

This duplex filter arrangement 2 may be termed asymmetric as the number of filter elements that the transmit signal TX passes from the duplex filter arrangement transmit terminal 3 to the antenna terminal 5 (transmit path) differs from the number of filter elements the receive signal RX passes from the antenna terminal 5 to the duplex filter receiver terminal 4 (receive path). In this aspect of the present disclosure the number of filter elements in line in the transmit path is two and in the receive path is one. With an asymmetric design the person skilled in the art can adopt the filter characteristics in the transmit path and the receive path differently according to design conception.

Figure 11:
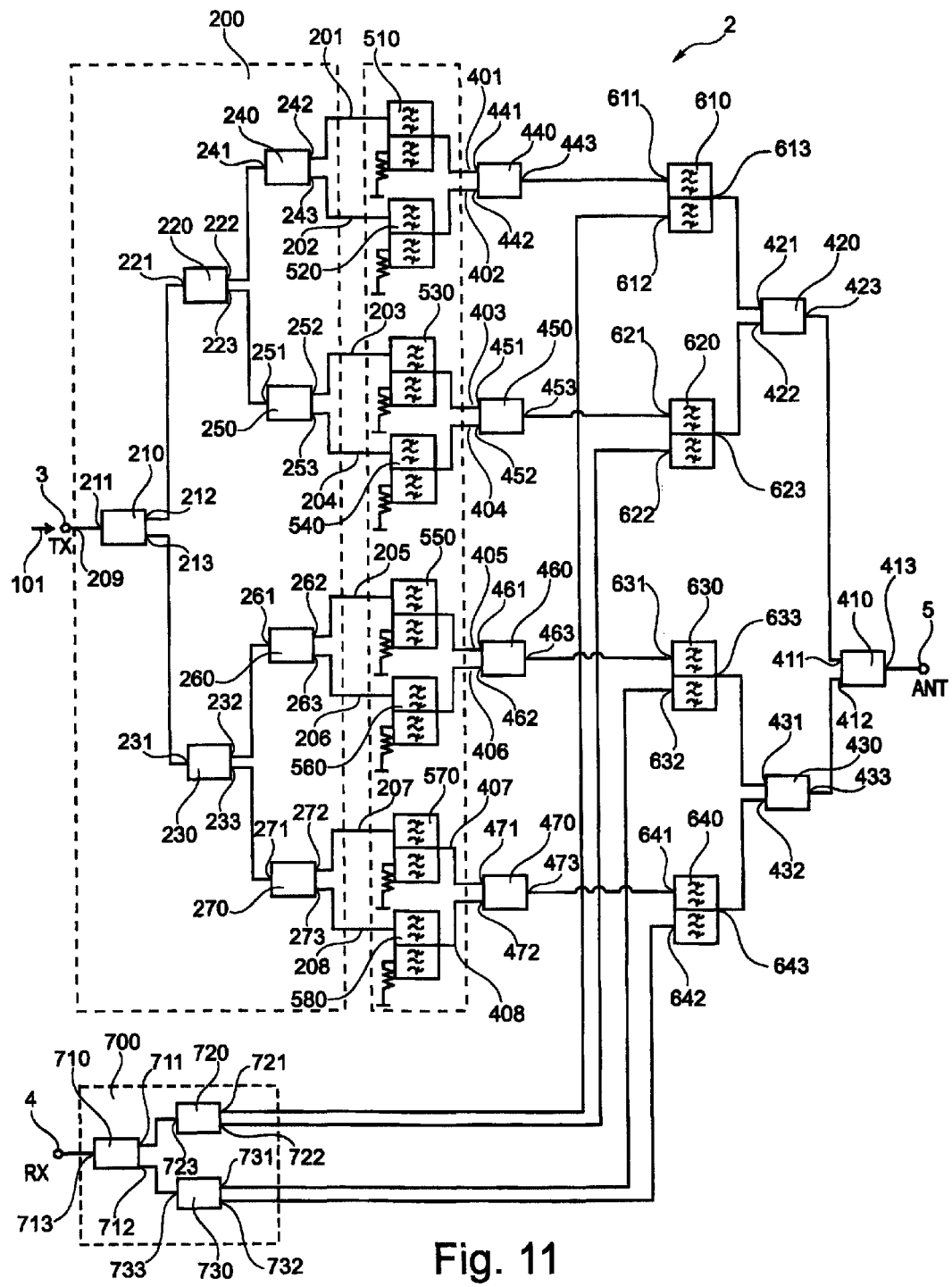
FIG. 11 shows yet another aspect of the filter arrangement according to the present disclosure.

Another aspect of the present disclosure is shown in FIG. 11. It is another asymmetric duplex filter arrangement 2 for filtering a transmit signal TX, received at a duplex filter arrangement transmit port 3 and providing the filtered transmit signal at a duplex filter arrangement antenna port 5. A receive signal RX, received at the duplex filter arrangement antenna port 5 is filtered and provided at a duplex filter arrangement receive port 4. In order to optimize the number of filter elements and to achieve a desired performance some duplex filter elements are merged in a structure of bidirectional couplers. The duplex filter arrangement 2 of this aspect of the present disclosure is now described in more detail.

In one aspect of the present disclosure at least the first signal combiner 410 is a bidirectional coupler, such as a so-called Wilkinson combiner or a so-called quadrature hybrid. The advantage of a bidirectional coupler in this duplex filter arrangement is, that the first signal combiner works for the partial transmit signals passed on to the first combiner input 411 and the second signal combiner input 412 as a signal combiner and for a receive signal as a signal divider at the same time. A Wilkinson combiner has the advantage over the quadrature combiner in that the outputs of the Wilkinson combiner are in phase with each other, whereas the outputs of the quadrature combiner have a 90° phase difference. This means that in using the quadrature combiner a circuit designer needs to take care in ensuring that the signals to be continued are in phase with each other.

The transmit signal TX is passed from the duplex-filter arrangement transmit port 3 to a transmit divide stage input 209. The transmit divide stage 200 is formed by a first transmit divider 210, a second transmit divider 220, a third transmit divider 230, a fourth transmit divider 240, a fifth transmit divider 250, a sixth transmit divider 260 and a seventh transmit divider 270. A first transmit signal combiner input 211 is identical to the transmit combine stage input 209. The first transmit divider 210 splits the transmit signal TX, received at the first transmit divider input 210 into a first portion and a second portion of the transmit signal. The first portion of the transmit signal TX is provided at a first transmit divider output 212 and the second portion of the transmit signal TX is provided at a second transmit divider output 213. The first transmit divider output 212 is connected to a second transmit divider input 221 of the second transmit divider 220 and the second transmit divider output 213 is connected to a third transmit divider input 231 of the third transmit divider 230. The second transmit divider 220 splits a second transmit divider input signal, received at the second transmit divider input 221 into a third portion and a fourth portion of the second transmit divider input signal. The third portion of the second transmit divider input signal is provided at a third transmit divider output 222. The fourth portion of the second transmit divider input signal is provided at a fourth transmit divider output 223. The third transmit divider output 222 is connected to a fourth transmit divider input 241 of the fourth transmit signal combiner 240. A seventh transmit divider output 242 and an eighth transmit divider output 243 of the fourth transmit signal combiner 240 finally form the first transmit divide stage output 201 and the second transmit divide stage output 202. In the same manner the fourth transmit divider output 223 is connected to a fifth transmit divider input 251 of the fifth transmit divider 250, the fifth transmit divider output 232 is connected to a sixth transmit divider input 261 of the sixth transmit divider 260, and the sixth transmit divider output 233 is connected to a seventh transmit divider input 271 of the seventh transmit divider 270. A seventh transmit divider output 241 of the fourth transmit divider 240 forms the first transmit divide stage output 201 of the transmit divide stage 200; a eighth transmit divider output 242 of the fourth transmit divider 240 forms the second transmit divide stage output 202 of the transmit divide stage 200; a ninth transmit divider output 252 of the fifth transmit divider 250 forms the third transmit divide stage output 203 of the transmit divide stage 200; a tenth transmit divider output 253 of the fifth transmit divider 250 forms the fourth transmit divide stage output 204 of the transmit divide stage 200; a eleventh transmit divider output 262 of the sixth transmit divider 260 forms the fifth transmit divide stage output 205 of the transmit divide stage 200; a twelfth transmit divider output 263 of the sixth transmit divider 260 forms the sixth transmit divide stage output 206 of the transmit divide stage 200; a thirteenth transmit divider output 272 of the seventh transmit divider 270 forms the seventh transmit divide stage output 207 of the transmit divide stage 200; and a fourteenth transmit divider output 273 of the seventh transmit divider 270 forms the eighth transmit divide stage output 208 of the transmit divide stage 200.

In this aspect of the present disclosure the power of the transmit filter arrangement input signal 101 is equally split into eight separate signal portions which are passed in parallel through a first duplex filter element 510, a second duplex filter element 520, a third duplex filter element 530, a fourth duplex filter element 540, a fifth duplex filter element 550, a sixth duplex filter element 560, a seventh duplex filter element 570, and an eighth duplex filter element 580 of the transmit filter stage 500. The eight duplex filter elements 510 . . . 580 are wired in the same manner as in the aspect of the present disclosure shown in FIG. 6.

In an inverse manner to the transmit divider stage 200 a transmit combine stage 400 in this aspect of the present disclosure is extended to eight signal combiner input signals. A first transmit combine stage input 401 is connected to a seventh transmit combiner input 441 of a fourth transmit combiner 440; a second combine stage input 402 is connected to an eighth transmit combiner input 442 of the fourth transmit combiner 440; a third combine stage input 403 is connected to a ninth transmit combiner input 451 of a fifth transmit combiner 450; a fourth combine stage input 404 is connected to a tenth transmit combiner input 452 of the fifth transmit combiner 450; a fifth combine stage input 405 is connected to an eleventh transmit combiner input 461 of a sixth transmit combiner 460; a sixth combine stage input 406 is connected to a twelfth transmit combiner input 462 of the sixth transmit combiner 460; a seventh combine stage input 407 is connected to a thirteenth transmit combiner input 471 of a seventh transmit combiner 470; a eighth combine stage input 408 is connected to a fourteenth transmit combiner input 472 of the seventh transmit combiner 470.

As already indicated in this aspect of the present disclosure the transmit combiners that form the transmit combiner stage and duplex filters for branching out of a receive signal are mixed. In order to distinguish the duplex-filter elements used for branching out the receive signal from the duplex filter elements 510 . . . 580 used in the transmit filter stage 500, duplex-filter elements used for branching out the receive signal are termed antenna duplex-filter.

A fourth transmit combiner output 443 of the fourth transmit combiner 440 is connected to a first transmit port 611 of a first antenna duplex filter 610. A fifth transmit combiner output 453 of the fifth transmit combiner 450 is connected to a second transmit port 621 of a second antenna duplex filter 620. A sixth transmit combiner output 463 of the sixth transmit combiner 460 is connected to a third transmit port 631 of a third antenna duplex filter 630; and a seventh transmit combiner output 473 of the seventh transmit combiner 470 is connected to a fourth transmit port 641 of a fourth antenna duplex filter 640. A first antenna port 613 of the first antenna duplex filter 610 is connected to a third transmit combiner input 421 of a second transmit combiner 420 and a second antenna port 623 of the second transmit combiner 620 is connected to a fourth transmit combiner input 422 of the second transmit combiner 420. A third antenna port 633 of the third antenna duplex filter 630 is connected to a fifth transmit combiner input 431 of the third transmit combiner 430 and a fourth antenna port 643 of the fourth antenna duplex filter 640 is connected to a sixth transmit combiner input 432 of the third transmit combiner 430. A second transmit combiner output 423 of the second transmit combiner 420 is connected to a first transmit combiner input 411 of the first transmit combiner 410; and a third transmit combiner output 433 of the third transmit combiner 430 is connected to a second transmit combiner input 412 of the first transmit combiner 410. In this aspect of the present disclosure the first transmit combiner output 413 of the first transmit combiner 410 forms the antenna terminal 5 of the duplex filter arrangement 2.

In order to form a receive signal a first receive port 612 of the first antenna duplex filter 610 is connected to a third receive signal combiner input 721 of a second receive signal combiner 720. A second receive port 622 of the second antenna duplex filter 620 is connected to a fourth receive signal combiner input 722 of a second receive signal combiner 720. A third receive port 632 of the third antenna duplex filter 630 is connected to a fifth receive signal combiner input 731 of a third receive signal combiner 730. A fourth receive port 642 of the fourth antenna duplex filter 640 is connected to a sixth receive signal combiner input 732 of the third receive signal combiner 730. A second antenna signal combiner output 723 of the second antenna signal combiner 720 is connected to a first receive signal combiner input 711 of a first receive signal combiner 710. A third antenna signal combiner output 733 of the third antenna signal combiner 730 is connected to a second receive signal combiner input 712 of the first signal combiner 710. The first receive signal combiner output 713 provides a receive signal RX at a receiver terminal 4 for example for a following receiver.

As the receive signal RX has to pass from the antenna terminal 5 to the first antenna port 613 of the first antenna duplex-filter 610, to the second antenna port 623 of the second antenna duplex filter 620, to the third antenna port 633 of the third duplex filter, and to the fourth antenna port 643 of the fourth duplex-filter 640, the first transceiver combiner 410, the second transceiver combiner 420 and the third transceiver combiner 430 are in this aspect of the present disclosure chosen as bidirectional couplers. A bidirectional coupler, such as a quadrature hybrid, or a Wilkinson coupler combine signals received at a first port and a second port into a single signal provided at a third port and in an inverse manner a signal received at the third port is split into two equal signal portions provided at the first port and the second port of the bidirectional coupler. Due to the way the filter arrangements are wired, all of the signal dividers and all of the signal combiners may be chosen as bidirectional couplers without changing the function of the described filter arrangements or deteriorating the signals. The advantage of choosing all signal dividers and all signal combiners as bidirectional couplers is that less different types of circuit elements are used in the filter arrangement which helps to simplify the manufacturing process. As noted above in case of use of quadrature combines care must be taken in order to combine the signals with the correct phase relation to each other otherwise the combination of the signals is destructive. Wilkinson splitters/combiners and quadrature couplers can be used mixed with the restriction that in one level of splitting/combining only the identical type is used, e.g. in FIG. 2: the first signal divider 210 and the first signal combiner 410 could be quadrature and the second signal divider 220, the third signal divider 230, the second signal combiner 420 and the third signal combiner 430 could be Wilkinson. Alternatively the first signal divider 210 and the first signal combiner 410 could be Wilkinson and whereas the second signal divider 220, the third signal divider 230, the second signal combiner 420 and the third signal combiner 430 can be quadrature. It will be appreciated that a combination of different elements comprising Wilkinson splitters/combiners and quadrature couplers can be used, but it is necessary to ensure that the choice of the elements is such that the phases of the combined signal are correct.

When passing from the antenna terminal 5 through the first transmit combiner 410 the receive signal is split due to the bidirectional character of the first transmit combiner 410 into a first receive signal portion provided at the first transmit combiner input 411 and a second receive signal portion provided at the second transmit combiner input 412. As the first receive portion signal is further split in the second transmit combiner 420 into a third receive portion signal, provided at the third transmit combiner input 421, and a fourth receive portion signal provided at the fourth transmit combiner input 422, the third receive portion signal passes the first antenna duplex filter 610 from the first antenna port 613 to the first receive port 612 of the first antenna duplex-filter 610 and the fourth receive portion signal passes the second antenna duplex filter 620 from the second antenna port 623 to the second receive port 622 of the second antenna duplex-filter 620. In the same manner the second receive portion signal is further split in the third transmit combiner 430 into a fifth receive portion signal, provided at the fifth transmit combiner input 431 and a sixth receive portion signal provided at the sixth transmit combiner input 432. The fifth receive portion signal passes the third antenna duplex filter 630 from the third antenna port 633 to the third receive port 632 of the third antenna duplex-filter 630. The sixth receive portion signal passes the fourth antenna duplex filter 640 from the fourth antenna port 643 to the fourth receive port 642 of the fourth antenna duplex-filter 640

In the receive signal portion RX all signals outside the receive band, that are present at the antenna terminal 5 are adequately suppressed when the receive signal portions pass in parallel the first antenna duplex filter 610 from the first antenna port 613 to the first receiver port 612, the second antenna duplex filter 620 from the second antenna port 623 to the second receiver port 622, the third antenna duplex filter 630 from the third antenna port 633 to the third receiver port 632 and the fourth antenna duplex filter 640 from the fourth antenna port 643 to the fourth receiver port 642. As already described above the filtered fraction signals are recombined in the receive combine stage 700.

With this duplex filter arrangement a fourfold higher power can be passed from the transmit terminal 3 to the antenna terminal 5. As two duplex filter elements are always in each possible transmit path for a signal passing from the transmit terminal 3 to the antenna terminal 4 the out of band signals in the transmit signals are filtered twice one after each other and therefore are better suppressed. On the other hand, each portion of the receive signal, passing from the antenna terminal 5 to the receiver terminal 4 is subjected only once to filtering which keeps the insertion loss low and thus enables a better receiver sensitivity.

The power capability of the filter arrangements of this disclosure is limited by the filter stage with the lower number of parallel components. In the first filter stage either four or eight filters could be used. The use of eight filters enables the use of eight different lower power amplifiers after the splitter network.

The present disclosure further relates to a computer program product embedded on a computer readable medium. The computer program product comprises executable instructions for the manufacture of the filter arrangement of the present disclosure.

While various embodiments of the present invention have been described above, it should be understood that they have been presented by way of example, and not limitation. It will be apparent to persons skilled in the relevant arts that various changes in form and detail can be made therein without departing from the scope of the invention. Thus, the present invention should not be limited by any of the above-described exemplary embodiments, but should be defined only in accordance with the following claims and their equivalents.

In addition to using hardware (e.g., within or coupled to a Central Processing Unit ("GPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, a layout description language (GDS, GDS II, Gerber, . . . ), a circuit description language (Spice) and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A filter arrangement for filtering a radio signal comprising at least one first filter stage, the at least one first filter stage comprising
    a divide stage for dividing a filter stage input signal into at least a first signal portion, and at least a second signal portion, wherein the at least a first signal portion is passed to at least a first divide stage output and the at least a second signal portion is passed to a at least second divide stage output,
    at least a first filter element comprising a first filter element input being connected to the first divide stage output and a first filter element output for providing at least a first filtered signal,
    at least a second filter element comprising a second filter element input being connected to the second divide stage output and a second filter element output for providing at least a second filtered signal,
    a combine stage for combining the first filtered signal, received at the first combine stage input and the second filtered signal, received at the second signal combiner input into a filter stage output signal,
    wherein at least one of the first filter element or the second filter element is a duplex filter with a first transmit port for passing a signal in a first frequency band to a first antenna port of the duplex filter and a first receive port for receiving a second signal in a second frequency band from the first antenna port, and wherein one of the first receive port of the duplex filter or the transmit port of the duplex filter is connected via an impedance to a reference level.

2. The filter arrangement according to claim 1 wherein the divide stage comprises at least a first signal divider and at least a second signal divider for dividing the filter arrangement input signal, wherein at least a first signal divider output of the first signal divider is connected to at least a first signal divider input of the second signal divider.

3. The filter arrangement according to claim 1 wherein the signal combining stage comprises at least a first signal combiner and a second signal combiner, wherein a first signal combiner output is connected to at least a second signal combiner input.

4. The filter arrangement according to claim 1 wherein at least one of the first filter element or the second filter element is a film bulk acoustic resonator filter (FBAR).

5. The filter arrangement according to claim 4 wherein the film bulk acoustic resonator filter (FBAR) is a duplex filter with a first port for passing a signal in a first frequency band to an antenna port of the FBAR filter and a second port for receiving a second signal in a second frequency band from the antenna port, wherein one of the first port of the FBAR duplexer or the second port of the duplex FBAR filter is connected via an impedance to a reference level.

6. The filter arrangement according to claim 1 wherein the signal divider and the signal combiner are bidirectional couplers.

7. The filter arrangement according to claim 6 wherein at least one of the bidirectional couplers is a Wilkinson combiner.

8. The filter arrangement according to claim 6 wherein at least one of the bidirectional couplers is a quadrature hybrid.

9. The filter arrangement according to claim 1 wherein the at least one filter stage is adopted for filtering one of the transmit signals or the receive signals.

10. The filter arrangement according to claim 9 wherein the at least a first filter stage is connected with at least a second filter stage, being adopted for filtering one of the transmit signals or the receive signals, and further comprising an antenna coupler for connecting at least a first filter stage and at least a second filter stage to provide one or more of the following functions:
    filtering a first receive signal in at least a first filter stage and filtering a second receive signal in at least a second filter stage
    filtering a first transmit signal in at least a first filter stage and filtering a first receive signal in at least a second filter stage,
    filtering a first transmit signal in at least a first filter stage and filtering a second transmit signal in at least a second filter stage.

11. The filter arrangement according to claim 10 wherein the number of filter elements in the first filter stage is different from the number of filter elements in the second filter stage.

12. The filter arrangement according to claim 11 wherein
    the first filter stage is adapted for filtering a transmit signal and the number of filter elements in the first filter stage is eight; and
    the second filter stage is adapted for filtering a receive signal and the number of filter elements in the second filter stage is four.

13. The filter arrangement according to claim 11 wherein
    a transmit signal is divided by a signal divider into a first transmit signal portion provided at a first signal divider output, a second transmit signal portion provided at a second signal divider output, a third transmit signal portion provided at a third signal divider output, a fourth transmit signal portion provided at a fourth signal divider output, a fifth transmit signal portion provided at a fifth signal divider output, a sixth transmit signal portion provided at a sixth signal divider output, a seventh transmit signal portion provided at a seventh signal divider output, and an eighth transmit signal portion provided at a eight signal divider output;

a first transmit filter element connected with a first transmit filter element input to the first filter stage output and providing a first TX filtered signal at a first transmit filter output a second transmit filter element connected with a second transmit filter input to the second divider stage output and providing a second TX filtered signal at a second transmit filter output;

a third transmit filter element connected with a third transmit filter input connected to the third divider stage output and providing a third TX filtered signal at a third transmit filter output, a fourth transmit filter element connected with a fourth transmit filter input connected to the fourth divider stage output and providing a fourth TX filtered signal at a fourth transmit filter output, a fifth transmit filter element connected with a fifth transmit filter input connected to the fifth divider stage output and providing a fifth TX filtered signal at a fifth transmit filter output, a sixth transmit filter element connected with a sixth transmit filter input connected to the sixth divider stage output and providing a sixth TX filtered signal at a sixth transmit filter output, a seventh transmit filter element connected with a seventh transmit filter input connected to the seventh divider stage output and providing a seventh TX filtered signal at a seventh transmit filter output, a eighth transmit filter element connected with a eighth transmit filter input connected to the eighth divider stage output and providing a eighth TX filtered signal at a eighth transmit filter output, a first signal combiner for combining the first filtered TX signal and the second filtered TX signal providing a first combined TX signal at a first signal combiner output a second signal combiner for combining the third filtered TX signal and the fourth filtered TX signal providing a second combined TX signal at a second signal combiner output a third signal combiner for combining the fifth filtered TX signal and the sixth filtered TX signal providing a third combined TX signal at a third signal combiner output a fourth signal combiner for combining the seventh filtered TX signal and the eighth filtered TX signal providing a fourth combined TX signal at a fourth signal combiner output a first duplex filter comprising a first transmit port connected to the first signal combiner output, and further comprising a first antenna port connected to a ninth signal combiner input of a fifth signal combiner, a second duplex filter comprising a second transmit port connected to the second signal combiner output, and further comprising a second antenna port connected to a tenth signal combiner input of a fifth signal combiner, a third duplex filter comprising a third transmit port connected to the third signal combiner output, and further comprising a third antenna port connected to a eleventh signal combiner input of a sixth signal combiner, a fourth duplex filter comprising a fourth transmit port connected to the fourth signal combiner output, and further comprising a fourth antenna port connected to a twelfth signal combiner input of a sixth signal combiner, a first bidirectional coupler comprising a first coupler port which is connected to the first antenna port of the first duplex filter, further comprising a second coupler port which is connected to the second antenna port of the second duplex filter, and further comprising a third coupler port a second bidirectional coupler comprising a forth coupler port which is connected to the third antenna port of the third duplex filter, further comprising a fifth coupler port which is connected to the fourth antenna port of the fourth duplex filter, and further comprising a sixth coupler port a third bidirectional coupler comprising a seventh coupler port which is connected to the third coupler port of the first bidirectional coupler and further comprising a eighth coupler port which is connected to the sixth coupler port of the second bidirectional coupler and further comprising a ninth coupler port for providing a transmit filter output signal for an antenna and for receiving a receive signal from the antenna, a combine stage comprising a first combine stage input which is connected to a first receive port of the first duplex filter for receiving a first receive signal portion, a second combine stage input which is connected to a second receive port of the second duplex filter for receiving a second receive signal portion, a third combine stage input which is connected to a third receive port of the third duplex filter for receiving a third receive signal portion, and a fourth combine stage input which is connected to a fourth receive port of the fourth duplex filter for receiving a fourth receive signal portion, further comprising a combine stage output for providing a combined receive signal of the first receive signal portion, the second receive signal portion, the third receive signal portion, and the fourth receive signal portion.

14. A chipset comprising a filter arrangement for filtering a radio signal comprising a filter stage, the filter stage comprising a first signal divider for distributing at least a first portion and at least a second portion of a first signal divider input signal received at a first signal divider input to a at least first signal divider output and at least a second signal divider output, a first signal combiner for combining at least a first signal received at at least a first signal combiner input and at least a second signal received at at least a second signal combiner input into a first combined output signal, at least a first filter element with a first filter element input being connected to the first output of the first signal divider and a first filter element output being connected to the first signal combiner input of the signal combiner, and at least a second filter element with a second filter element input being connected to the second output of the signal divider and a second filter element output being connected to the at least second combiner input of the first signal combiner, wherein at least one of the first filter element or the second filter element is a duplex filter with a first transmit port for passing a signal in a first frequency band to a first antenna port of the duplex filter and a first receive port for receiving a second signal in a second frequency band from the first antenna port, and wherein one of the first receive port of the duplex filter or the transmit port of the duplex filter is connected via an impedance to a reference level.

15. A radio station comprising a filter arrangement for filtering a radio signal comprising a filter stage, the filter stage comprising
- a first signal divider for distributing at least a first portion and at least a second portion of a first signal divider input signal received at a first signal divider input to at least a first signal divider output and at least a second signal divider output,
- a first signal combiner for combining at least a first signal received at at least a first signal combiner input and at least a second signal received at at least a second signal combiner input into a first combined output signal,
- at least a first filter element with a first filter element input being connected to the first output of the first signal divider and a first filter element output being connected to the first signal combiner input of the signal combiner, and
- at least a second filter element with a second filter element input being connected to the second output of the signal divider and a second filter element output being connected to the second combiner input of the first signal combiner,
- wherein at least one of the first filter element or the second filter element is a duplex filter with a first transmit port for passing a signal in a first frequency band to a first antenna port of the duplex filter and a first receive port for receiving a second signal in a second frequency band from the first antenna port, and wherein one of the first receive port of the duplex filter or the transmit port of the duplex filter is connected via an impedance to a reference level.

16. A method of manufacturing a filter arrangement for filtering a radio signal comprising a filter stage, the filter stage comprising
- a first signal divider for distributing at least a first portion and at least a second portion of a first signal divider input signal received at a first signal divider input to at least a first signal divider output and at least a second signal divider output,
- a first signal combiner for combining at least a first signal received at at least a first signal combiner input and at least a second signal received at at least a second signal combiner input into a first combined output signal,
- at least a first filter element with a first filter element input being connected to the first output of the first signal divider and a first filter element output being connected to the first signal combiner input of the signal combiner, and
- at least a second filter element with a second filter element input being connected to the second output of the signal divider and a second filter element output being connected to the second combiner input of the first signal combiner,
- wherein at least one of the first filter element or the second filter element is a duplex filter with a first transmit port for passing a signal in a first frequency band to a first antenna port of the duplex filter and a first receive port for receiving a second signal in a second frequency band from the first antenna port, and wherein one of the first receive port of the duplex filter or the transmit port of the duplex filter is connected via an impedance to a reference level.

17. A computer program product comprising a non-transitory computer-usable medium having control logic stored therein for causing a computer to manufacture a filter arrangement for filtering a radio signal comprising a filter stage, the filter stage comprising
- a first signal divider for distributing at least a first portion and at least a second portion of a first signal divider input signal received at a first signal divider input to at least a first signal divider output and at least a second signal divider output,
- a first signal combiner for combining at least a first signal received at at least a first signal combiner input and at least a second signal received at at least a second signal combiner input into a first combined output signal,
- at least a first filter element with a first filter element input being connected to the first output of the first signal divider and a first filter element output being connected to the first signal combiner input of the signal combiner, and
- at least a second filter element with a second filter element input being connected to the second output of the signal divider and a second filter element output being connected to the second combiner input of the first signal combiner,
- wherein at least one of the first filter element or the second filter element is a duplex filter with a first transmit port for passing a signal in a first frequency band to a first antenna port of the duplex filter and a first receive port for receiving a second signal in a second frequency band from the first antenna port, and wherein one of the first receive port of the duplex filter or the transmit port of the duplex filter is connected via an impedance to a reference level.

* * * * *